(12) United States Patent
Pan

(10) Patent No.: US 12,191,154 B2
(45) Date of Patent: Jan. 7, 2025

(54) METHOD FOR MANUFACTURING SEMICONDUCTOR STRUCTURE, SEMICONDUCTOR STRUCTURE, AND MEMORY

(71) Applicant: CHANGXIN MEMORY TECHNOLOGIES, INC., Hefei (CN)

(72) Inventor: Junbo Pan, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 547 days.

(21) Appl. No.: 17/486,707

(22) Filed: Sep. 27, 2021

(65) Prior Publication Data

US 2023/0013786 A1 Jan. 19, 2023

Related U.S. Application Data

(63) Continuation of application No. PCT/CN2021/108909, filed on Jul. 28, 2021.

(30) Foreign Application Priority Data

Jul. 13, 2021 (CN) .......................... 202110791904.0

(51) Int. Cl.
*H01L 21/308* (2006.01)
*H01L 21/027* (2006.01)

(52) U.S. Cl.
CPC ...... *H01L 21/3086* (2013.01); *H01L 21/0274* (2013.01)

(58) Field of Classification Search
CPC ....................................................... H01L 21/02
See application file for complete search history.

(56) References Cited

U.S. PATENT DOCUMENTS

| 4,495,025 A | * | 1/1985 | Haskell | ............. | H01L 21/76229 |
| | | | | | 257/E21.549 |
| 4,650,544 A | * | 3/1987 | Erb | ................... | H01L 29/66181 |
| | | | | | 257/E21.235 |
| 2010/0003621 A1 | * | 1/2010 | Yin | ........................ | G11B 5/102 |
| | | | | | 430/323 |

FOREIGN PATENT DOCUMENTS

| CN | 104024137 A | * | 9/2014 | ............... B66B 1/34 |
| CN | 104124137 A | | 10/2014 | |
| CN | 104124150 A | | 10/2014 | |
| CN | 110896046 A | | 3/2020 | |
| CN | 112698525 A | | 4/2021 | |

(Continued)

OTHER PUBLICATIONS

International Search Report cited in PCT/CN2021/108909, mailed Apr. 13, 2022, 8 pages.

*Primary Examiner* — William A Harriston
(74) *Attorney, Agent, or Firm* — Kilpatrick Townsend & Stockton LLP

(57) ABSTRACT

The present application provides a method for manufacturing a semiconductor structure, a semiconductor structure, and a memory. The method for manufacturing a semiconductor structure includes the following steps: providing a substrate, and forming a stabilizing layer on the substrate; forming a stabilizing structure consisting of a plurality of linear structures and grooves among the linear structures; forming a hard mask layer covering the stabilizing structure; forming a mask pattern connected to a top of the linear structure and an inner wall of the groove on the hard mask layer; and transferring the mask pattern to the substrate.

13 Claims, 11 Drawing Sheets

(56) References Cited

FOREIGN PATENT DOCUMENTS

JP S647522 A 1/1989

* cited by examiner

METHOD FOR MANUFACTURING SEMICONDUCTOR STRUCTURE, SEMICONDUCTOR STRUCTURE, AND MEMORY

CROSS-REFERENCES TO RELATED APPLICATIONS

The present application is a continuation application of International Application No. PCT/CN2021/108909, filed on Jul. 28, 2021, which claims priority to Chinese patent application No. 202110791904.0, filed on Jul. 13, 2021. The disclosures of International Application No. PCT/CN2021/108909 and Chinese patent application No. 202110791904.0 are hereby incorporated by reference in their entireties.

TECHNICAL FIELD

The present application relates to the field of semiconductor manufacturing technologies, and particularly, to a method for manufacturing a semiconductor structure, a semiconductor structure and a memory.

BACKGROUND

During a manufacturing process of a chip, a pattern is required to be transferred with a hard mask. The hard mask directly affects a size and a yield of the final transferred pattern.

The hard mask is etched with an etching process to form a mask pattern. The mask pattern needs to be wet-cleaned to remove the hard mask remained subsequent to the etching. For some small-sized mask patterns, due to physical erosion of a wet-cleaning chemical liquid and a centrifugal force of a rapid rotation of a wafer during a cleaning process, a micro-etching effect can exist in the chemical liquid or a part of the chemical liquid, which causes an insufficient adhesion force of a bottom of the mask pattern, thereby causing the mask pattern to be distorted in its shape or peeled off from a substrate, and eventually leading to failure of transfer of the mask pattern.

Therefore, how to solve the forgoing problems has become an urgent problem to be solved by those skilled in the art.

SUMMARY

According to some embodiments, a first aspect of the present application provides a method for manufacturing a semiconductor structure, including:
  providing a substrate, and forming a stabilizing layer on the substrate;
  forming a stabilizing structure consisting of a plurality of linear structures and grooves among the linear structures on the stabilizing layer;
  forming a hard mask layer covering the stabilizing structure;
  forming a mask pattern connected to a top of the linear structure and an inner wall of the groove on the hard mask layer; and
  transferring the mask pattern to the substrate.

According to some embodiments, a second aspect of the present application provides a semiconductor structure, which is formed with the forgoing method for manufacturing the semiconductor structure.

According to some embodiments, a third aspect of the present application provides a memory, including the forgoing semiconductor structure.

BRIEF DESCRIPTION OF THE DIAGRAMS

DETAILED DESCRIPTION

Figure 1:
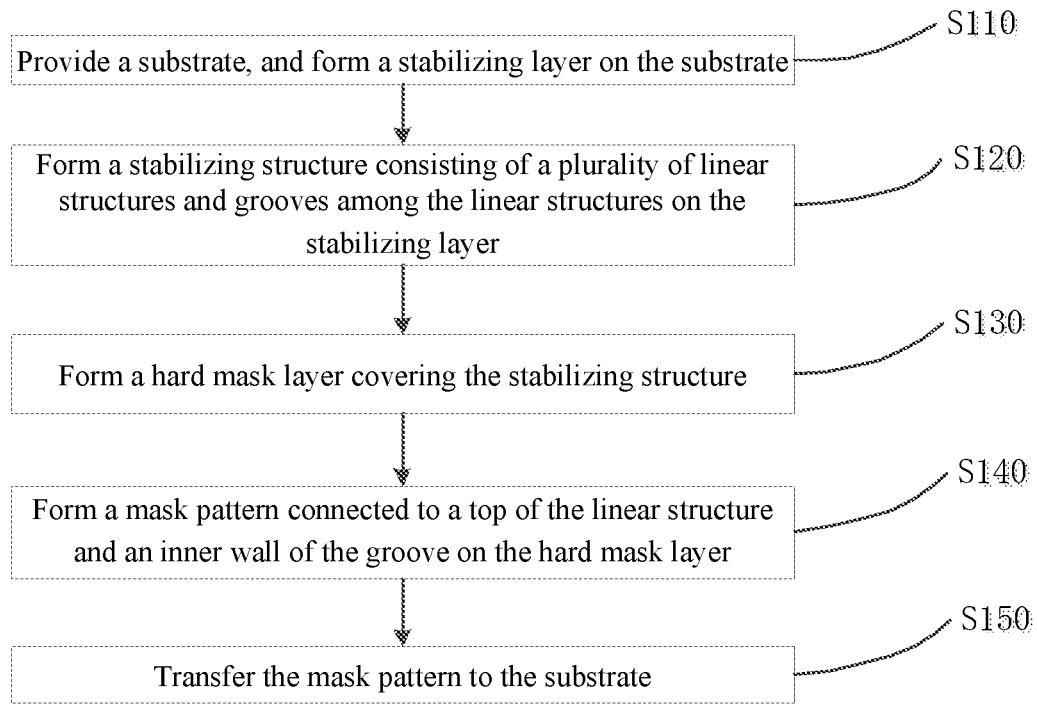
FIG. 1 is a flowchart showing a method for manufacturing a semiconductor structure according to an exemplary embodiment.

In order to facilitate the understanding of the present application, the following makes a more comprehensive description of the present application with reference to relevant drawings. Embodiments of the present application are shown in the drawings. However, the present application can be implemented in many different forms and is not limited to the embodiments described herein. On the contrary, an objective of providing these embodiments is to make the understanding of the disclosure of the present application more thorough and comprehensive.

Unless otherwise specified, all technical and scientific terms used herein have a same meaning as commonly understood by those skilled in the art to which the present application belongs. The terms used in the description of the present application herein are only for an objective of describing specific embodiments, and are not intended to limit the present application.

For example, as used herein, singular forms "a", "an" and "the" can also include plural forms, unless the context clearly indicates otherwise. It should also be understood that the terms "comprising/including", "having", or the like designates the existence of the stated features, wholes, steps, operations, assemblies, parts or combinations thereof, but do not exclude possibility of existence or addition of one or more other features, wholes, steps, operations, assemblies, parts or combinations thereof. Meanwhile, the term "and/or" used in this specification includes any and all combinations of related listed items.

During a manufacturing process of a chip, a pattern is required to be transferred with a hard mask. The hard mask directly affects a size and a yield of the final transferred pattern.

The hard mask is etched with an etching process to form a mask pattern. The mask pattern needs to be wet-cleaned to remove the hard mask remained subsequent to the etching. For some small-sized mask patterns, due to physical erosion of a wet-cleaning chemical liquid and a centrifugal force of a rapid rotation of a wafer during a cleaning process, a micro-etching effect can exist in the chemical liquid or a part of the chemical liquid, which causes an insufficient adhesion force of a bottom of the mask pattern, thereby causing the mask pattern to be distorted in its shpae or peeled off from a substrate, and eventually causing failure of transfer of the mask pattern.

Figure 3:
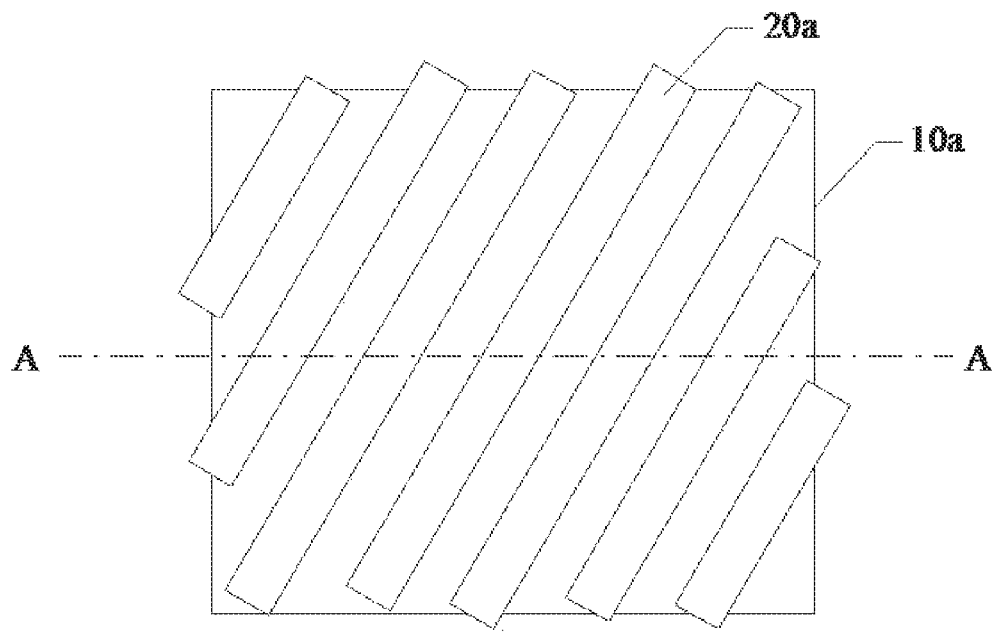
FIGS. 3 to 8 are schematic structural diagrams presented at steps in a schematic flowchart of a method for manufacturing a semiconductor structure in a related art.
Figure 4:
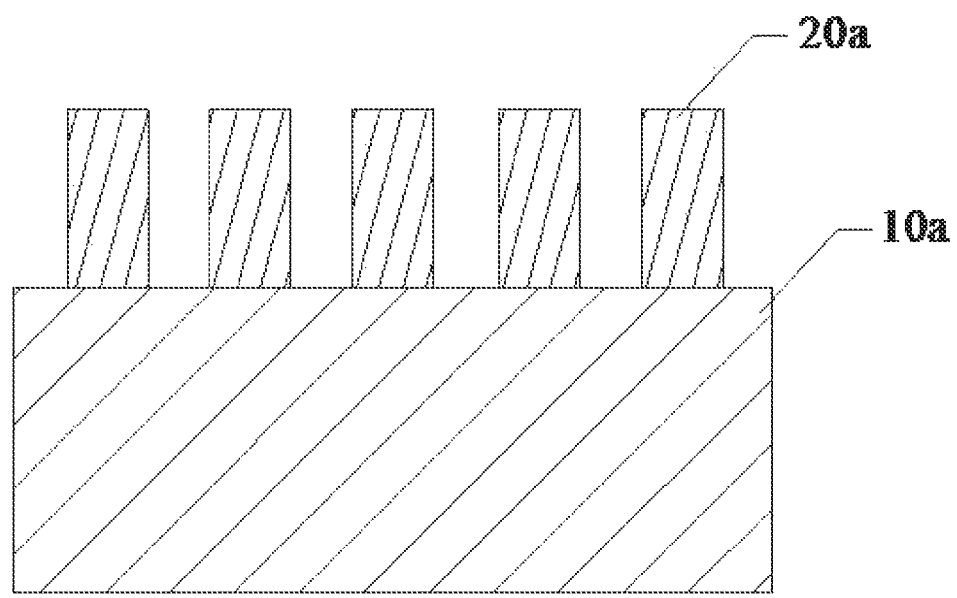

The related art provides a method for manufacturing a semiconductor structure. FIGS. 3 to 8 are structural diagrams in a process for manufacturing a semiconductor in the related art. Referring to FIG. 3, FIG. 3 is a top view of the semiconductor structure, and shows a substrate 10a and a mask pattern 20a formed on the substrate 10a. Referring to FIG. 4, FIG. 4 is a cross-sectional view taken along a line A-A of FIG. 3. It can be seen from FIG. 4 that the mask pattern 20a is formed on an end surface of a top of the substrate 10a. It can be understood that the mask pattern 20a is formed by etching a hard mask on the substrate 10a.

Figure 5:
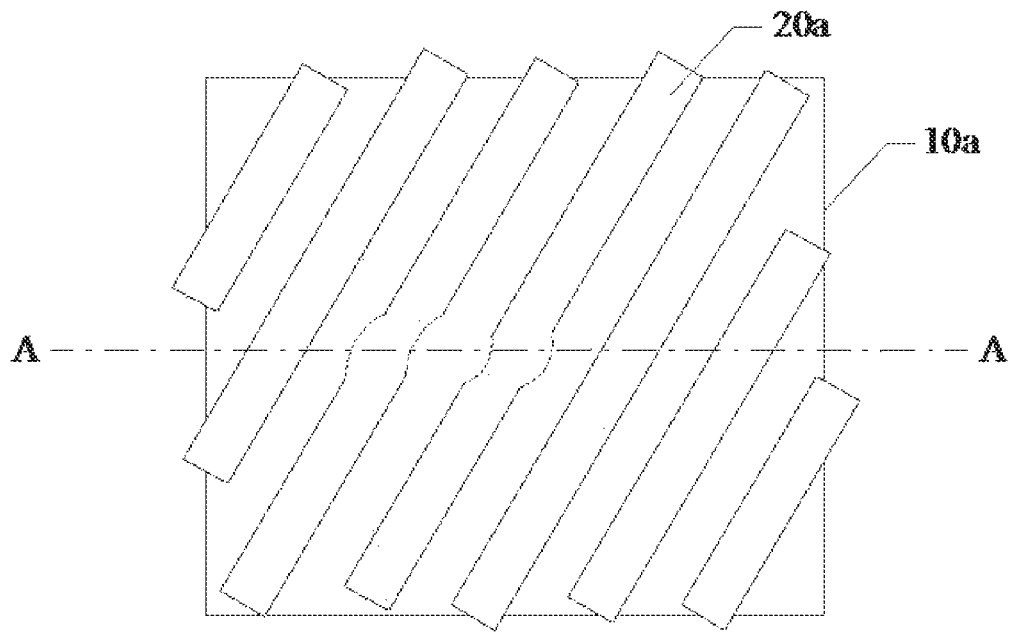
Figure 6:
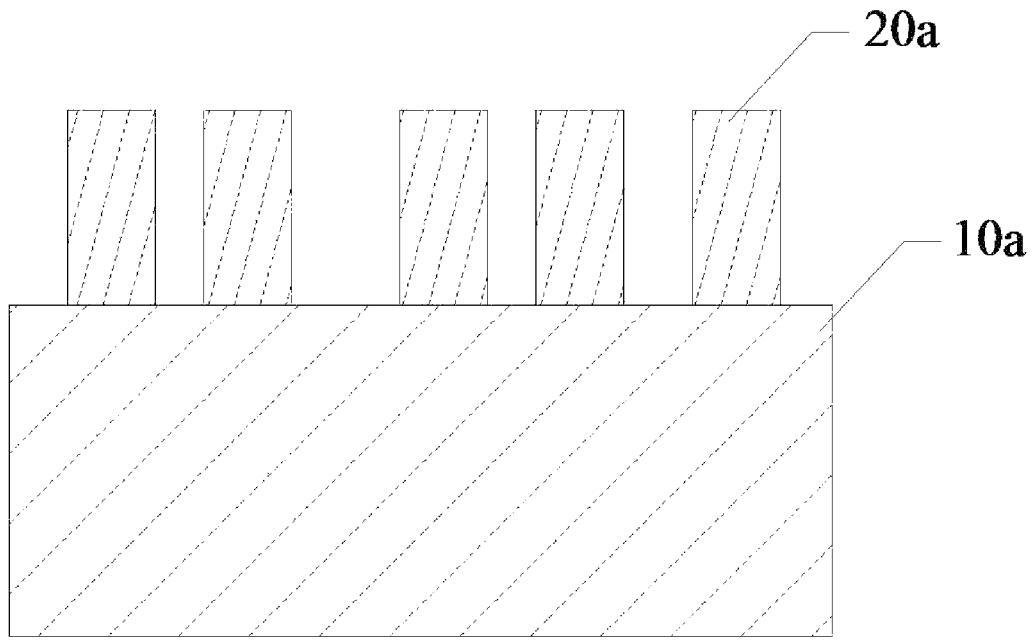

It is known that in a process for manufacturing the semiconductor structure, wet cleaning is required to remove the hard mask remained subsequent to etching. Due to physical erosion of a wet-cleaning chemical liquid and a centrifugal force of a rapid rotation of a wafer during a cleaning process, a micro-etching effect can exist in the chemical liquid or a part of the chemical liquid, which causes an insufficient adhesion force of a bottom of the mask pattern 20a. Continuing to refer to FIG. 5, FIG. 5 is a top view of the semiconductor structure and shows the substrate 10a and the mask pattern 20a formed on the substrate 10a. It can be seen from FIG. 5 that a relative position of the mask pattern 20a and the substrate 10a is changed. That is, the mask pattern 20a is twisted or wriggled. Referring to FIG. 6, FIG. 6 is a cross-sectional view taken along a line A-A of FIG. 5. It can be seen from FIG. 6 that the mask pattern 20a is formed on the end surface of the top of the substrate 10a. A shape of the mask pattern 20a is twisted or wriggled, which changes a distance between parts of structures of the mask pattern 20a.

Figure 7:
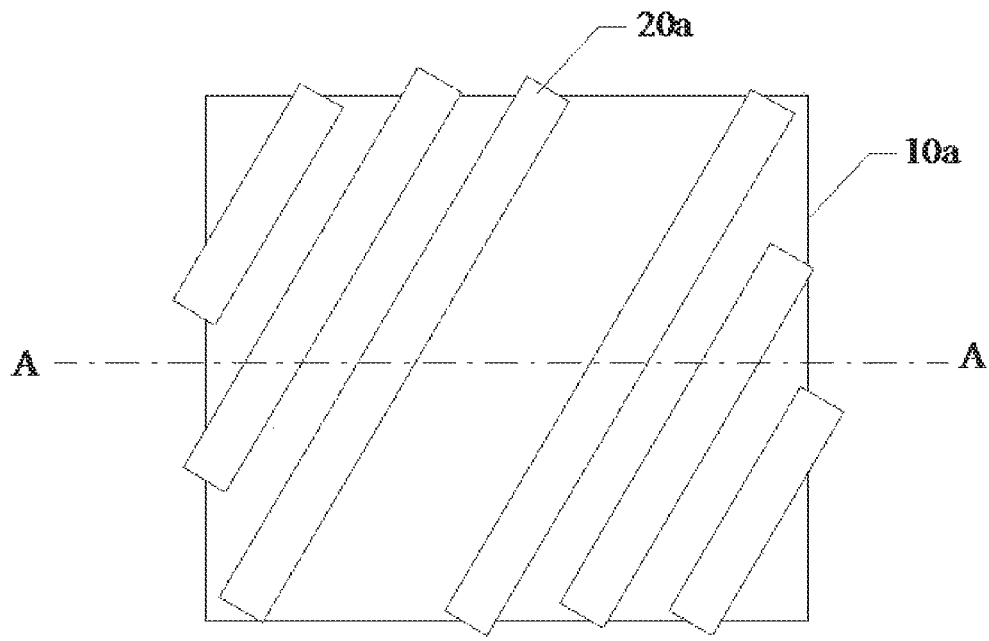
Figure 8:
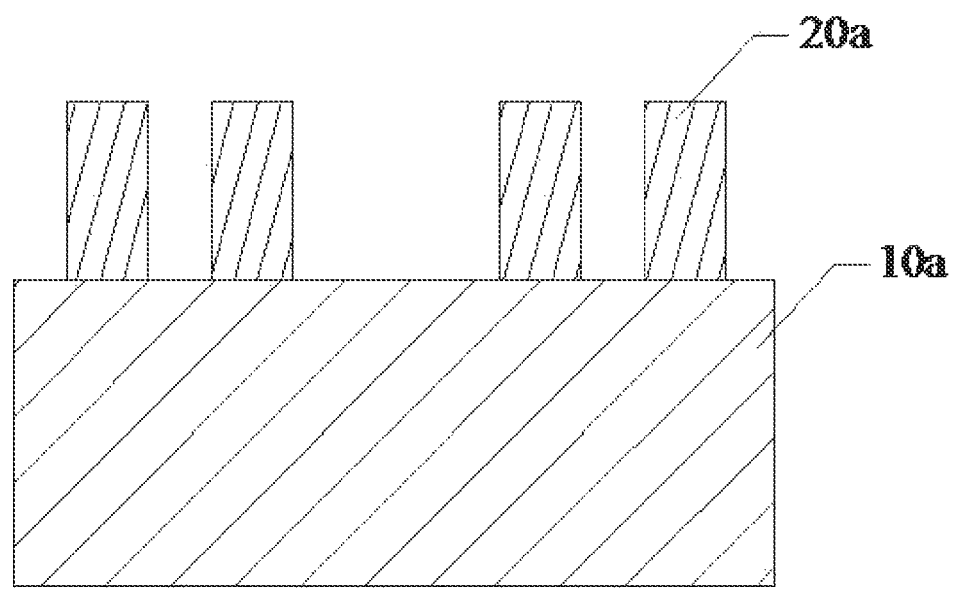

Continuing to refer to FIG. 7, FIG. 7 is a top view of the semiconductor structure, and shows the substrate 10a and the mask pattern 20a formed on the substrate 10a. It can be seen from FIG. 7 that a part of the structure of the mask pattern 20a is missed, that is, the structure of the mask pattern 20a is broken away. Referring to FIG. 8, FIG. 8 is a cross-sectional view taken along a line A-A of FIG. 7. It can be seen from FIG. 8 that the mask pattern 20a is formed on the end surface of the top of the substrate 10a, and a part of the structure of the mask pattern 20a is missed. The missing of the part of the structure of the mask pattern 20a causes failure of the pattern transfer in the manufacturing process, resulting in failure of the production of the semiconductor structure.

As shown in FIG. 1, the present application provides a method for manufacturing a semiconductor structure, including: S110, providing a substrate 10, and forming a stabilizing layer 20 on the substrate 10.

Figure 9:
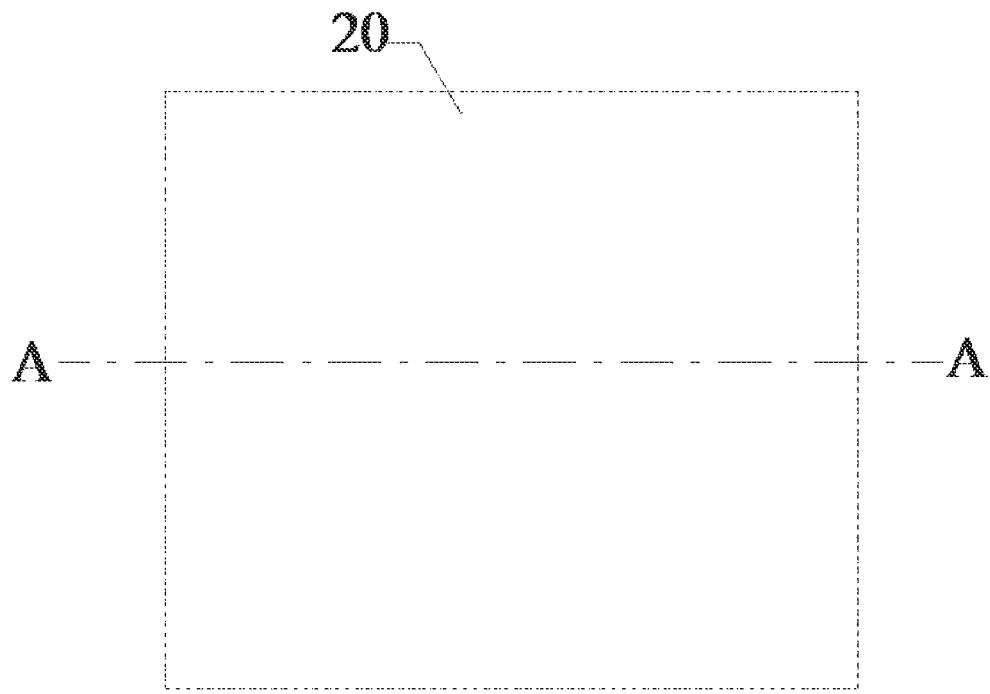
FIGS. 9 to 21 are schematic structural diagrams presented at steps in a flowchart of the method for manufacturing the semiconductor structure according to an exemplary embodiment.
Figure 10:
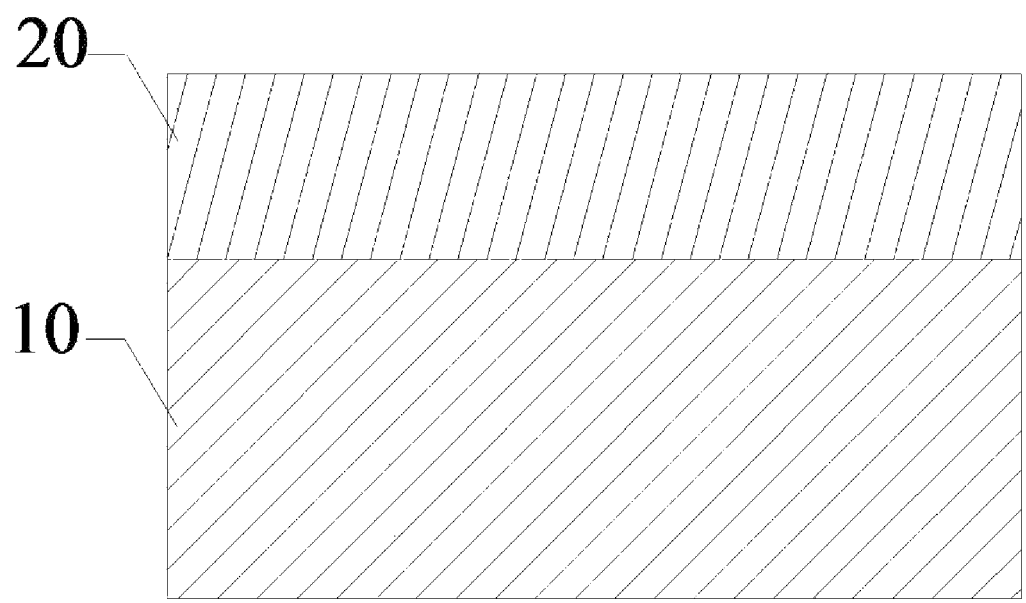

As shown in FIG. 9, FIG. 9 is a top view of the semiconductor structure in a manufacturing process, and shows the substrate 10 and the stabilizing layer 20 formed on the substrate 10. Referring to FIG. 10, FIG. 10 shows a cross-sectional view taken along a line A-A of FIG. 9. It can be seen from FIG. 10 that the stabilizing layer 20 is formed on the end surface of the top of the substrate 10. As the substrate 10, any substrate 10 in the prior art can be used as required, and a structure and a material of the substrate 10 can also be adjusted adaptively as needed. For example, the material of the substrate 10 can be one or any combination of silicon, germanium, silicon germanium, silicon carbide, gallium arsenide, indium gallium, silicon on insulator (SOI), or germanium on insulator (GOI). Semiconductor devices, such as an NMOS device, a PMOS device, a CMOS device, a resistor, a capacitor, an inductor, or the like, can also be formed on the substrate 10.

The stabilizing layer 20 is formed on the substrate 10, where the stabilizing layer 20 can be formed on the substrate with a deposition process. A material of the stabilizing layer 20 can be at least one of SiN (silicon nitride), $SiO_2$ (silicon oxide), SiON (silicon oxynitride) and BARC (Bottom Anti-Reflection Layer).

S120: forming a stabilizing structure consisting of a plurality of linear structures 21 and grooves 22 among the linear structures 21 on the stabilizing layer 20.

Figure 13:
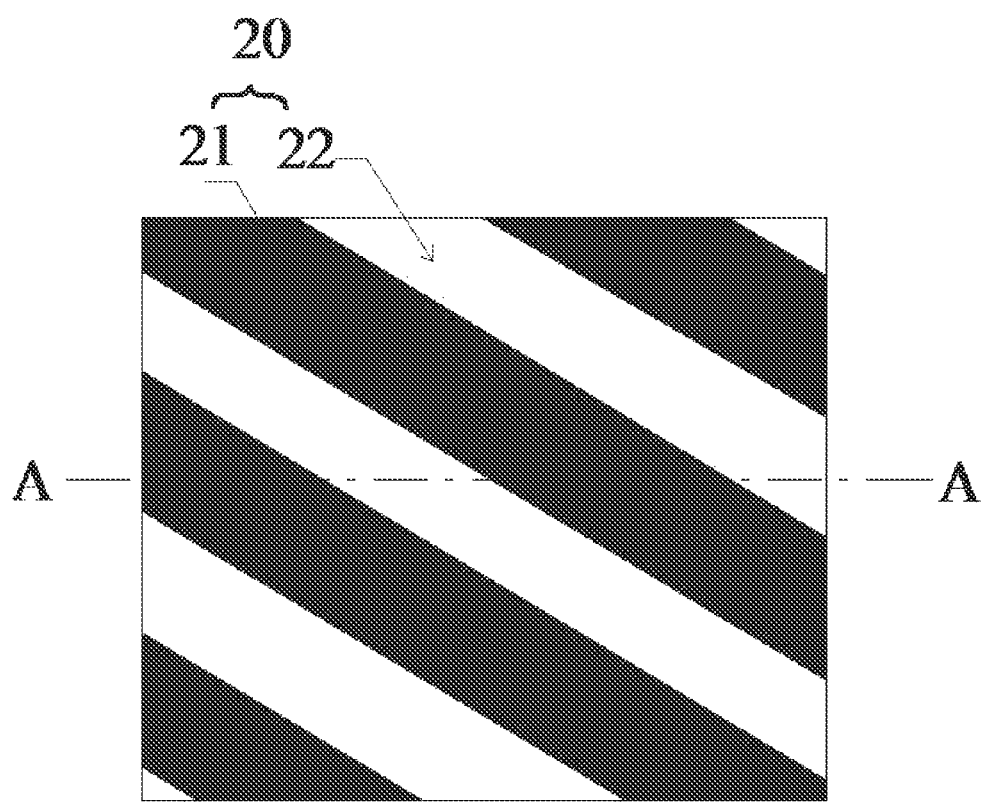
Figure 14:
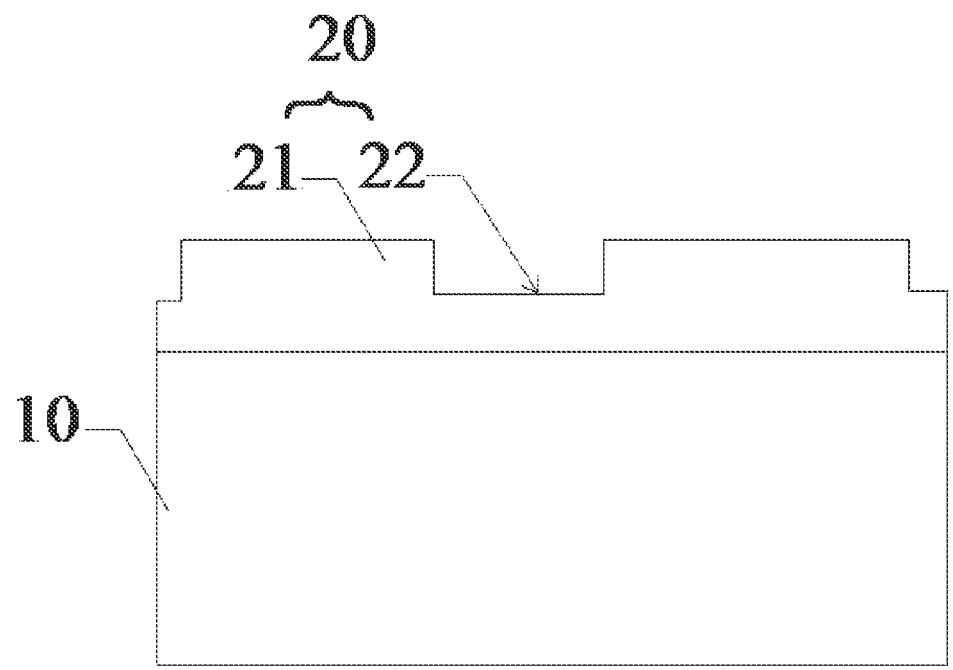

Specifically, as shown in FIG. 13, FIG. 13 shows a top view of the semiconductor structure in the manufacturing process. FIG. 13 shows the substrate 10 and the stabilizing structure formed on the substrate 10. The stabilizing structure includes the linear structure 21 and the groove 22. Referring to FIG. 14, FIG. 14 shows a cross-sectional view taken along a line A-A of FIG. 13, and it can be seen from FIG. 14 that the stabilizing structure is formed on the end surface of the top of the substrate 10. The linear structure 21 of the stabilizing structure is formed on a top of the stabilizing layer 20. The top of the stabilizing layer 20 can also be considered as a side of the stabilizing layer 20 away from the substrate 10. One groove 22 is correspondingly enclosed by two adjacent linear structures 21.

A plurality of linear structures 21 are provided and arranged at intervals in a direction perpendicular to a length of the linear structure 21. A plurality of grooves 22 are provided and arranged at intervals in the direction perpendicular to the length of the linear structure 21.

S130: forming a hard mask layer 30 covering the stabilizing structure.

Figure 15:
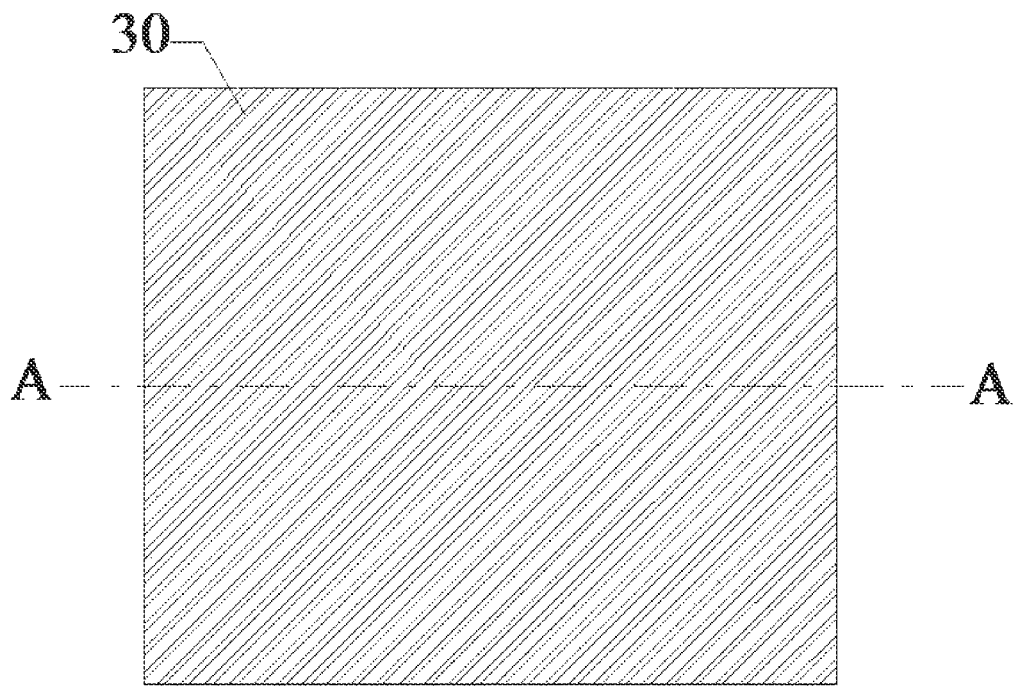
Figure 16:
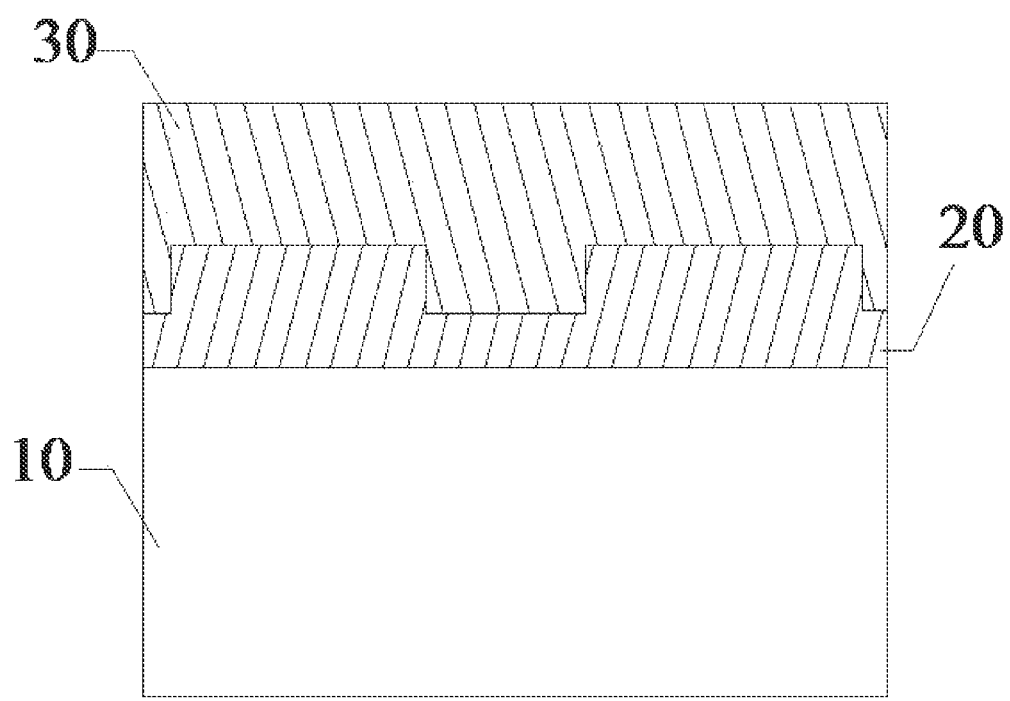

Referring to FIG. 15, FIG. 15 shows a top view of the semiconductor structure in the manufacturing process, and shows the substrate 10, the stabilizing structure, and the hard mask layer 30 formed on the stabilizing structure. Referring to FIG. 16, FIG. 16 is a cross-sectional view taken along a line A-A of FIG. 15. It can be seen from FIG. 16 that the stabilizing structure is formed on the end surface of the top of the substrate 10, and an exposed surface of the stabilizing structure is covered with the formed hard mask layer 30. In some embodiments, as shown in FIG. 16, the hard mask layer 30 is connected to a top of the linear structure 21 and an inner wall of the groove 22, respectively. The groove 22 is completely filled with the formed hard mask layer 30. In a direction perpendicular to the substrate 10, the formed hard mask layer 30 has a certain thickness above the top of the linear structure 21. The hard mask layer 30 on the top of the linear structure 21 extends horizontally to an edge of the stabilizing structure. A material of the hard mask layer 30 can be polysilicon, silicon nitride, or amorphous carbon.

S140: forming a mask pattern connected to the top of the linear structure 21 and the inner wall of the groove 22 on the hard mask layer 30.

Figure 17:
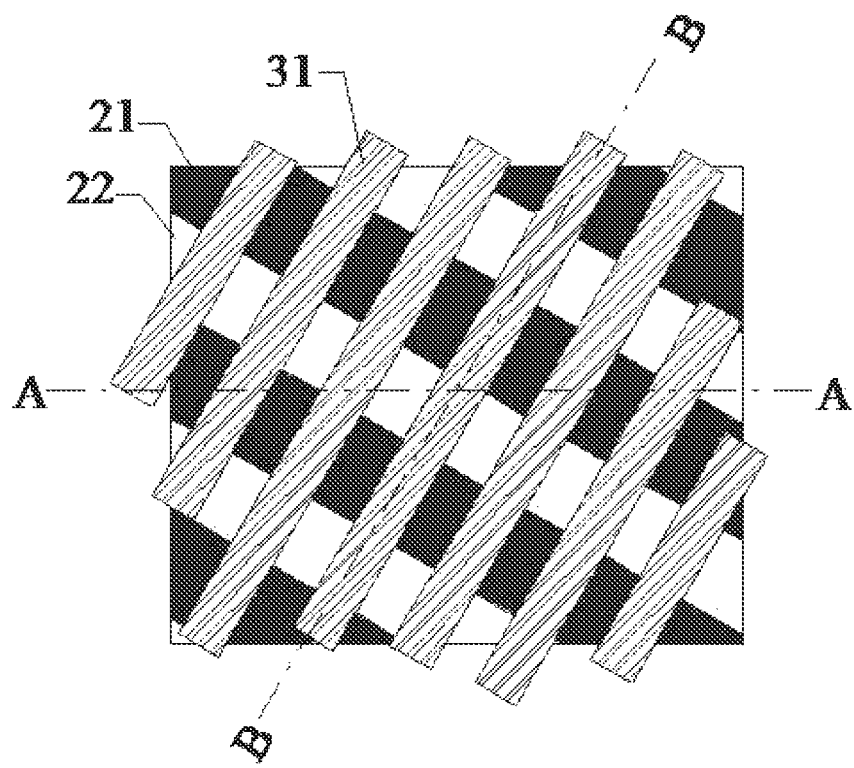
Figure 18:
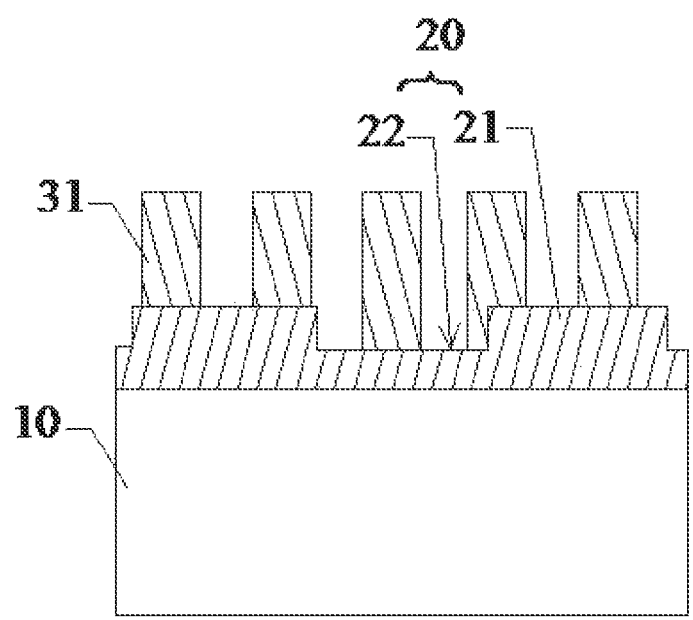
Figure 19:
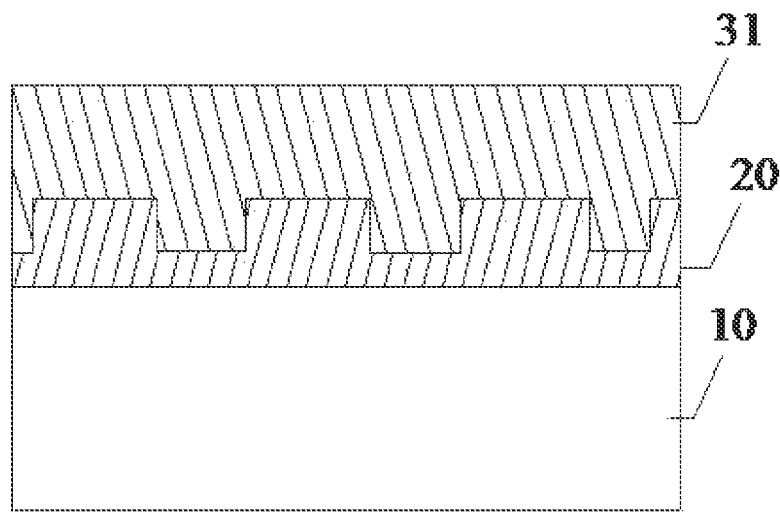

Referring to FIG. 17, FIG. 17 shows a top view of the semiconductor structure in the manufacturing process, and shows the stabilizing structure and the mask pattern formed on the stabilizing structure. Referring to FIG. 18, FIG. 18 shows a cross-sectional view taken along a line A-A of FIG. 17. It can be seen from FIG. 18 that the stabilizing structure is formed on the end surface of the top of the substrate 10, and the mask pattern formed on the hard mask layer 30 is connected to the top of the linear structure 21 and the inner wall of the groove 22, respectively. Continuing to refer to FIG. 18, the mask pattern is connected to the top of the linear structure 21, and the mask pattern is connected to the inner wall of the groove 22. The inner wall of the groove 22 includes a bottom wall and two opposite sidewalls. Referring to FIG. 19, FIG. 19 shows a cross-sectional view taken along a line B-B of FIG. 17. It can be seen from FIG. 19 that the mask pattern is connected to the top of the linear structure 21, and the mask pattern is connected to the inner wall of the groove 22.

S150: transferring the mask pattern to the substrate 10.

Figure 20:
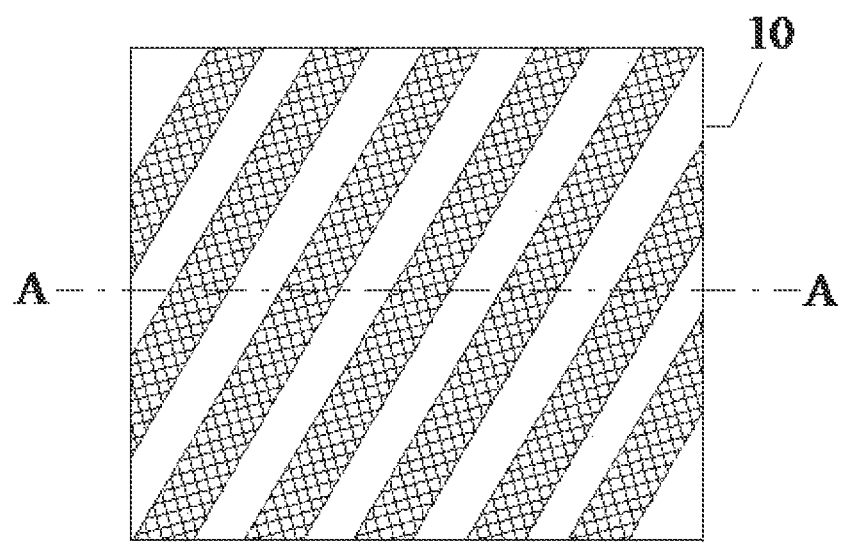
Figure 21:
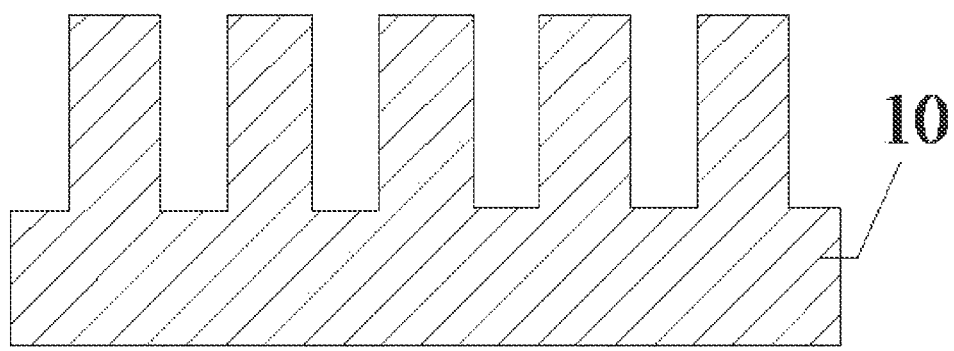

Referring to FIG. 20, FIG. 20 shows a top view of the substrate 10 in the manufacturing process. Referring to FIG. 21, FIG. 21 is a cross-sectional view taken along a line A-A of FIG. 20. It can be seen from FIG. 21 that the mask pattern has been transferred to the substrate 10, and FIG. 21 exemplarily shows an transfer effect of the mask pattern subsequent to the manufacturing process.

In the embodiment of the present application, with the stabilizing structure consisting of the plurality of linear structures 21 and the grooves 22 among the linear structures 21 formed on the stabilizing layer 20, and the mask pattern connected to the top of the linear structure 21 and the inner wall of the groove 22 of the stabilizing structure, that is, the mask pattern is in horizontal and vertical contact with the stabilizing structure, a larger contact area is provided between the mask pattern and the stabilizing structure, and an increase in the contact area can significantly enhance an adhesion force of the mask pattern, thereby effectively avoiding the distortion and peeling of the mask pattern during the manufacturing process, and ensuring the yield of the semiconductor subsequent to the manufacturing process.

Figure 2:
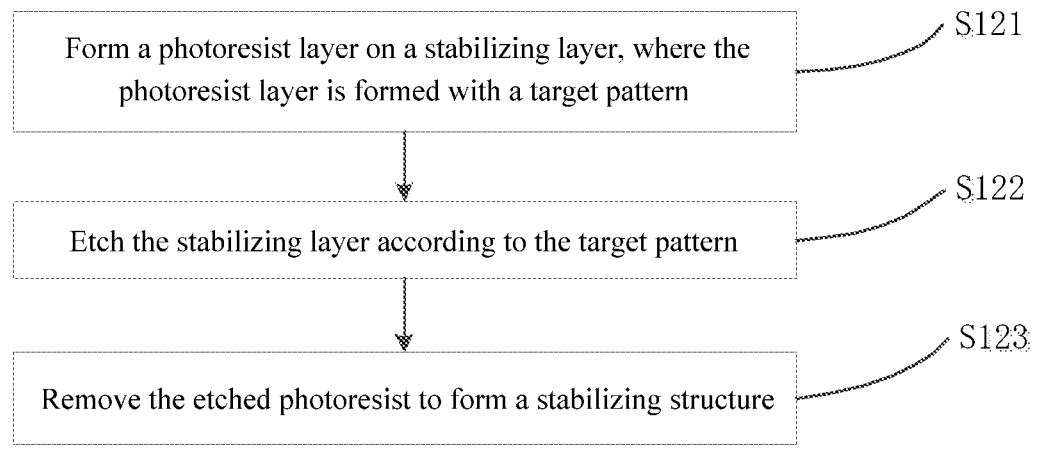
FIG. 2 is a flowchart showing a method for manufacturing a semiconductor structure according to another exemplary embodiment.

As shown in FIG. 2, in some embodiments, the step S120 of forming the stabilizing structure consisting of the plurality of linear structures 21 and the grooves 22 among the linear structures 21 on the stabilizing layer 20 includes:

S121: forming a photoresist layer 40 on the stabilizing layer 20, where the photoresist layer 40 forms a target pattern.

Figure 11:
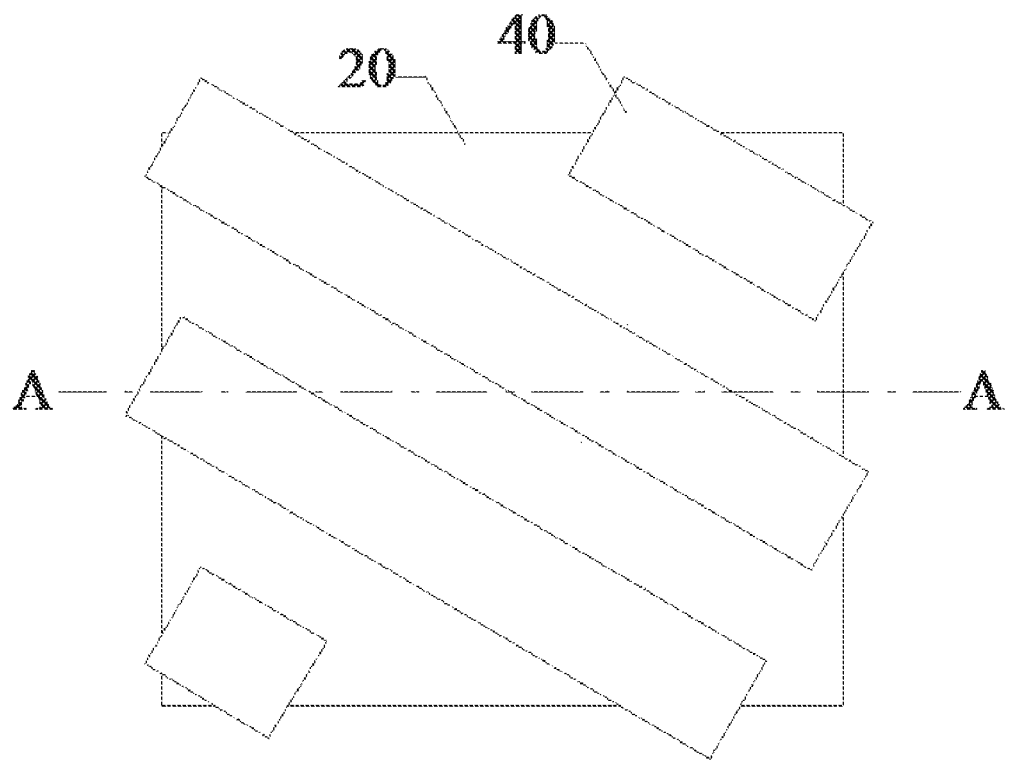
Figure 12:
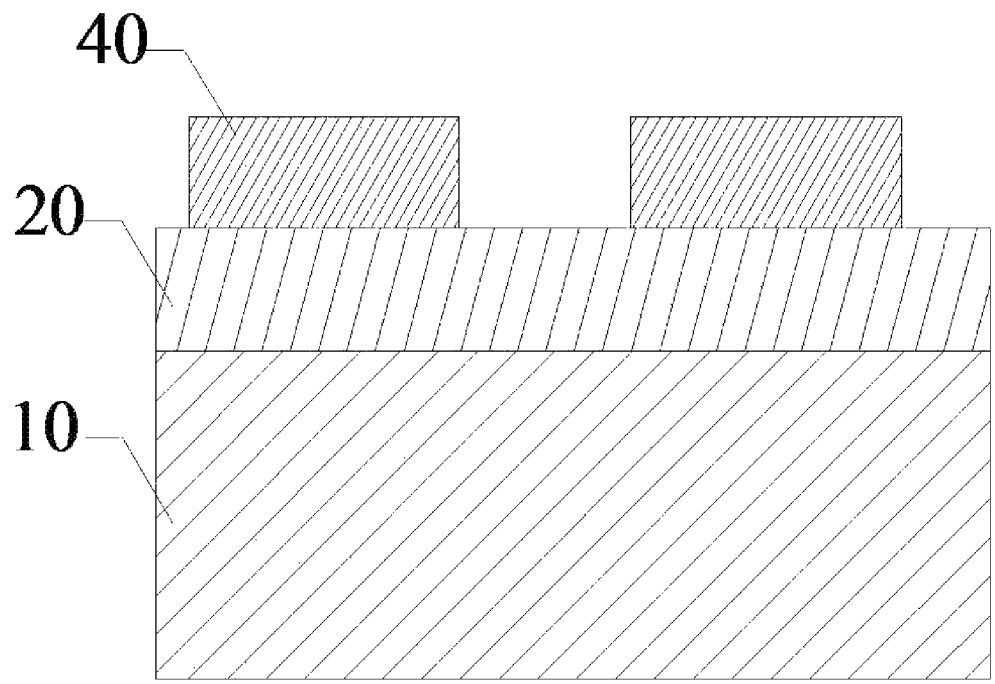

Referring to FIG. 11, FIG. 11 is a top view of the semiconductor structure in the manufacturing process, and shows the stabilizing layer 20 and the photoresist layer 40 formed on the stabilizing layer 20. Referring to FIG. 12, FIG. 12 shows a cross-sectional view taken along a line A-A of FIG. 11. It can be seen from FIG. 12 that the stabilizing layer 20 and the photoresist layer 40 are stacked on the substrate 10 in sequence. The photoresist layer 40 is located on a side of the stabilizing layer 20 away from the substrate 10. The photoresist layer 40 is patterned with an exposure process to form the target pattern. The photoresist layer 40 is formed on the stabilizing layer 20 with a spin coating process.

S122: etching the stabilizing layer 20 according to the target pattern.

The stabilizing layer 20 containing the target pattern is etched back. Referring to FIGS. 13 and 14, subsequent to the etching, the target pattern is transferred to the stabilizing layer 20 to form the linear structure 21 of the stabilizing structure, and an etched portion of the stabilizing layer 20 is formed as the groove 22 of the stabilizing structure. The surface of the substrate 10 is not exposed by the etched stabilizing layer 20.

S123: removing the etched photoresist to form the stabilizing structure.

In some other embodiments, in a length direction of the linear structure 21, a cross section of the linear structure 21 includes, but is not limited to, a rectangular shape. It should be noted that the cross section of the linear structure 21 can have a regular shape or an irregular shape, which is not specifically limited in the present application.

Similarly, in the length direction of the linear structure 21, a shape of a cross section of the groove 22 includes, but is not limited to, a rectangular shape. It should be noted that the cross section of the groove 22 can have a regular shape or an irregular shape, which is not specifically limited in the present application, and a specific shape is set according to requirements of the manufacturing process of the semiconductor structure.

In the embodiment of the present application, on the one hand, the linear structure 21 and the groove 22 of which cross sections are rectangular can provide a sufficient attachment area for formation of the mask pattern. An increase in the attachment area of the mask pattern is equivalent to enhancement in an adhesion force at a bottom of the mask pattern. On the other hand, during a wet cleaning process, a physical scouring force of the chemical liquid and a centrifugal force of a rapid rotation of a wafer during cleaning can be directly applied to the linear structure 21 with the mask pattern connected to a sidewall of the groove 22 via the sidewall of the groove 22. It can also be understood that the scouring force and the centrifugal force are transmitted to the stabilizing structure, thereby effectively avoiding the distortion and peeling of the mask pattern during the manufacturing process, and ensuring the yield of the semiconductor structure subsequent to the manufacturing process.

Similarly, a cross-sectional dimension of each of the linear structures 21 can be the same or different. A cross-sectional dimension of each of the grooves 22 can be the same or different. The specific dimensions of the linear structure 21 and the groove 22 are set according to the requirements of the manufacturing process of the semiconductor.

In some embodiments, in a length direction of the vertical linear structure 21, the linear structure 21 has a width greater than the groove 22.

In the embodiment of the present application, the linear structure 21 has the width greater than the groove 22, so that the stabilizing structure provides a sufficient attachment area for formation of the mask pattern on the top of the linear structure 21, and ensures structure stability of the mask pattern.

In some embodiments, the step S140 of forming the mask pattern connected to the top of the linear structure 21 and the inner wall of the groove 22 on the hard mask layer 30 includes:

S141: etching the hard mask layer 30 to form a plurality of hard mask layer strips 31, where the plurality of hard mask layer strips 31 are arranged at intervals to form the mask pattern. A preset included angle is formed between a length direction of the hard mask layer strip 31 and the length direction of the linear structure 21.

Continuing to refer to FIG. 17, the surface of the stabilizing structure is covered with the plurality of hard mask layer strips 31. The preset included angle is formed between the length direction of the hard mask layer strips 31 and the length direction of the linear structure 21. Each of the hard mask layer strips 31 is formed to be connected to the top of the linear structure 21 and the inner wall of the groove 22 of the stabilizing structure. In some embodiments, the length directions of the hard mask layer strips 31 are parallel to each other. In a direction perpendicular to the length direction of the hard mask layer strips 31, the hard mask layer strips 31 are arranged at equal or unequal intervals on the surface of the stabilizing structure. It can be understood that the surface of the stabilizing structure consists of an end surface of a top of the stabilizing structure and the inner wall of the groove 22.

In the embodiment of the present application, the preset included angle is formed between the length direction of the hard mask layer strip 31 and the length direction of the linear structure 21, and each of the hard mask layers 30 can be in contact with the top of the linear structure 21 and the inner wall of the groove 22 of the stabilizing structure so that each hard mask layer 31 has a larger contact area with the stabilizing structure. An increase in the contact area can significantly enhance an adhesion force of the hard mask layer strip 31, which can effectively avoid the distortion and peeling of the hard mask layer 31 during the manufacturing process, and ensure the yield of the semiconductor structure subsequent to the manufacturing process.

In other embodiments, prior to the step S141 of etching the hard mask layer 30, the method further includes:

S142: forming the photoresist layer on the hard mask layer 30, where the photoresist layer forms the mask pattern.

The photoresist layer is formed on the hard mask layer 30 with a spin coating process.

One photoresist layer is spin-coated on the hard mask layer 30. The photoresist layer is located on a side of the hard mask layer 30 away from the substrate 10. The photoresist layer is patterned by an exposure process to form a photolithography pattern, where in an etching process, the photolithography pattern is transferred to the hard mask layer 30 to form the mask pattern.

In some embodiments, the included angle between the length direction of the hard mask layer strip 31 formed with the etching process and the length direction of the linear structure 21 is within a range of 30° to 60°.

In the embodiment of the present application, the included angle between the length direction of the formed hard mask layer strip 31 and the length direction of the linear structure 21 is in the range of 30° to 60°, so that each of the hard mask layers 30 is arranged in a staggered manner with the linear structure 21 and the groove 22 of the stabilizing structure. Such an arrangement makes the hard mask layer 30 have an effective contact area with the linear structure 21 and the groove 22 of the stabilizing structure. The effective contact area formed by the included angle between the length direction of the hard mask layer strip 31 and the length direction of the linear structure 21 in the range of 30° to 60° can significantly enhance the adhesion force of the hard mask layer 31, thereby effectively avoiding the distortion and peeling of the mask pattern during the manufacturing process, and ensuring the yield of the semiconductor subsequent to the manufacturing process.

In still other embodiments, in the length direction of the hard mask layer strips 31, each of the hard mask layer strips 31 is formed to be connected to the top of at least one of the linear structures 21 and the inner wall of at least one of the grooves 22.

In the embodiment of the present application, each of the hard mask layer strips 31 is formed to be connected to the top of at least one of the linear structures 21 and the inner wall of at least one of the grooves 22, which can ensure that each of the hard mask layer strips 31 is in horizontal and vertical contact with the stabilizing structure. Therefore, the hard mask layer strip 31 has a greater contact area with the stabilizing structure. An increase in the contact area can significantly enhance the adhesion force of the hard mask layer strip 31, thereby effectively avoiding the distortion and peeling of the mask pattern during the manufacturing process, and ensuring the yield of the semiconductor subsequent to the manufacturing process.

In some embodiments, subsequent to the step S140 of forming the mask pattern on the hard mask layer 30, the method further includes:

S143, cleaning the mask pattern.

The mask pattern is cleaned with the wet cleaning process. The wet cleaning process includes, but is not limited to, physical scouring using a chemical liquid, and an action of the centrifugal force accompanying the rapid rotation of the wafer during the cleaning process to speed up the cleaning process.

In some embodiments, the step S150 of transferring the mask pattern to the substrate 10 includes:

transferring the mask pattern to the substrate 10 with a dry etching process.

In some embodiments, subsequent to the step S150 of transferring the mask pattern to the substrate 10, the method further includes:

S160: removing the mask pattern and the stabilizing structure.

The mask pattern and the stabilizing layer 20 are removed with dry etching or wet etching.

According to a second aspect of the present application, the present application provides a semiconductor structure, which is formed with the forgoing method for manufacturing the semiconductor structure.

The semiconductor structure manufactured according to the forgoing embodiments can be used in the manufacture of various integrated circuits (ICs). The IC according to the present application is, for example, a memory circuit, such as random access memory (RAM), a dynamic RAM (DRAM), a synchronous DRAM (SDRAM), a static RAM (SRAM), a read-only memory (ROM), or the like. The IC according to the present application can also be a logic device, such as a programmable logic array (PLA), an application specific integrated circuit (ASIC), a combined DRAM logic integrated circuit (buried DRAM), a radio frequency circuit, or any other circuit device. An IC chip according to the present application can be used in a user's electronic products such as a personal computer, a portable computer, a game console, a cellular phone, a personal digital assistant, a camcorder, a digital camera, a mobile phone, or the like.

According to a third aspect of the present application, the present application provides a memory including the forgoing semiconductor structure.

In the description of the present specification, descriptions with reference to the terms "some embodiments", "other embodiments", "ideal embodiments", or the like mean that specific features, structures, materials, or characteristics described in conjunction with the embodiments or exemplary description are included in at least one embodiment or example of the present application. In this specification, schematic description of the forgoing terms does not necessarily refer to the same embodiment or example.

The technical features of the forgoing embodiments can be combined arbitrarily. In order to make description concise, all possible combinations of various technical features in the forgoing embodiments are not described. However, as long as there is no contradiction in combinations of these technical features, all technical features should be considered within the scope of this specification.

The forgoing embodiments only express a plurality of embodiments of the present application, and the description was relatively specific and detailed, but should not be understood as a limitation to the patent scope of the present application. It should be indicated for the person skilled in the art that various modifications and improvements can be made without departing from the concept of the present application, and these modifications and improvements all belong to the protection scope of the present application.

Therefore, the protection scope of the present application should be subject to attached claims.

What is claimed is:

1. A method for manufacturing a semiconductor structure, comprising:
   providing a substrate, and forming a stabilizing layer on the substrate;
   forming a stabilizing structure consisting of a plurality of linear structures and grooves among the linear structures on the stabilizing layer;
   forming a hard mask layer covering the stabilizing structure;
   forming a mask pattern connected to a top of the linear structures and an inner wall of the grooves on the hard mask layer;
   transferring the mask pattern to the substrate; and
   removing the mask pattern and the stabilizing structure; and,
   wherein forming the mask pattern connected to the top of the linear structures and the inner wall of the grooves on the hard mask layer comprises:
   etching the hard mask layer to form a plurality of hard mask layer strips, wherein thehard mask layer strips are arranged at intervals to form the mask pattern; wherein a preset included angle is formed between a length direction of the hard mask layer strips and a length direction of the linear structures.

2. The method for manufacturing the semiconductor structure according to claim 1, wherein the forming the stabilizing structure consisting of the plurality of linear structures and the grooves among the linear structures on the stabilizing layer comprises:
   forming a photoresist layer on the stabilizing layer, wherein the photoresist layer is formed with a target pattern;
   etching the stabilizing layer according to the target pattern; and
   removing the photoresist layer after the etching to form the stabilizing structure.

3. The method for manufacturing the semiconductor structure according to claim 1, wherein
   in a length direction of the linear structures, the linear structures each have a rectangular cross section.

4. The method for manufacturing the semiconductor structure according to claim 1, wherein
   in a length direction of the linear structures, the grooves each have a rectangular cross section.

5. The method for manufacturing the semiconductor structure according to claim 1, wherein
   in a direction perpendicular to a length direction of the linear structures, the linear structures each have a width greater than the grooves.

6. The method for manufacturing the semiconductor structure according to claim 1, wherein prior to the etching the hard mask layer, the method further comprises:
   forming a photoresist layer on the hard mask layer, wherein the photoresist layer constitutes the mask pattern.

7. The method for manufacturing the semiconductor structure according to claim 6, wherein
   forming the photoresist layer on the hard mask layer comprises forming the photoresist layer on the hard mask layer with a spin coating process.

8. The method for manufacturing the semiconductor structure according to claim 1, wherein
   the preset included angle between the length direction of the hard mask layer strips formed with an etching process and the length direction of the linear structures is within a range of 30° to 60°.

9. The method for manufacturing the semiconductor structure according to claim 1, wherein
   in the length direction of the hard mask layer strips, each of the hard mask layer strips is formed to be connected to the top of at least one of the linear structures or the inner wall of at least one of the grooves.

10. The method for manufacturing the semiconductor structure according to claim 1, wherein subsequent to the forming the mask pattern on the hard mask layer, the method further comprises:
    cleaning the mask pattern.

11. The method for manufacturing the semiconductor structure according to claim 1, wherein the transferring the mask pattern to the substrate comprises:
    transferring the mask pattern to the substrate with a dry etching process.

12. A semiconductor structure, wherein the semiconductor structure is formed by the method for manufacturing the semiconductor structure according to claim 1.

13. A memory, comprising the semiconductor structure according to claim 12.

* * * * *